United States Patent

Barel (10) Patent No.: US 8,124,428 B2
(45) Date of Patent: Feb. 28, 2012

(54) STRUCTURE AND METHOD FOR TESTING MEMS DEVICES

(75) Inventor: Gregory Van Barel, Aartselaar (BE)

(73) Assignee: Imec, Leuven (BE)

( * ) Notice: Subject to any disclaimer, the term of this patent is extended or adjusted under 35 U.S.C. 154(b) by 299 days.

(21) Appl. No.: 12/641,022

(22) Filed: Dec. 17, 2009

(65) Prior Publication Data

US 2010/0163870 A1  Jul. 1, 2010

Related U.S. Application Data

(60) Provisional application No. 61/141,063, filed on Dec. 29, 2008.

(51) Int. Cl.
*H01L 21/66* (2006.01)
*H01L 23/58* (2006.01)
*G01R 31/26* (2006.01)

(52) U.S. Cl. ....... 438/14; 438/18; 257/48; 257/E21.521; 257/E21.524

(58) Field of Classification Search .................... 438/11, 438/14, 18; 257/48, E21.521, E21.524
See application file for complete search history.

(56) References Cited

U.S. PATENT DOCUMENTS 6,258,610 B1 * 7/2001 Blatchford et al. ............. 438/14

OTHER PUBLICATIONS

Rico, Raquel Hellin, "Characterization of the Etching of Ge Sacrificial Layers for Surface Micromachining of MEMS", In Proceedings 15th Micromechanics Europe Workshop, pp. 115-118, 2004.
Trigg, Alastair, "Applications of Infrared Microscopy to IC and MEMS Packaging", IEEE Transactions on Electronics Packaging Manufacturing, vol. 26, No. 3, Jul. 2003, pp. 232-238.
Monk, David J. et al., "Hydrofluoric Acid Etching of Silicon Dioxide Sacrificial Layers", J. Electrochem. Soc., vol. 141 (1), pp. 270-274, Jan. 1994.
Shell, Melissa et al., "Applications of Infrared Microscopy for Bond Pad Damage Detection", IEEE/RPS, pp. 152-159, 1991.
Cheyney, Tom, "More Important, More Complex: Mems Metrology", Solid States, Mar. 2008, pp. 56-58.
Verwillegen, M.L. et al., "Strain Diagnostics- and Etch Technology Mask Set for Surface Micro-Machined Structures", Master's Thesis, Hogeschool van Utrecht, UMECC, Utrecht Micro Engineering Competence Centre, 2000.

* cited by examiner

*Primary Examiner* — Hoai V Pham
(74) *Attorney, Agent, or Firm* — McDonnell Boehnen Hulbert & Berghoff LLP (57) ABSTRACT

A method for determining the presence of a sacrificial layer under a structure. The method includes providing at least one structure arranged above a substrate having a major surface lying in a plane, the at least one structure being clamped at at least one side. The method further includes exerting a force, such as a mechanical force, on the at least one structure. The force may have a predetermined amplitude and a component perpendicular to the substrate. Still further, the method includes determining the deflection of the at least one structure perpendicular to the plane of the substrate, and correlating the deflection of the at least one structure to the presence of a sacrificial layer between the substrate and the structure.

20 Claims, 10 Drawing Sheets

STRUCTURE AND METHOD FOR TESTING MEMS DEVICES

RELATED APPLICATIONS

This application claims priority under 35 U.S.C. §119(e) to U.S. Provisional Patent Application Ser. No. 61/141,063, filed on Dec. 29, 2008, the full disclosure of which is incorporated herein by reference.

FIELD

The present disclosure relates to the field of MEMS devices. More particularly, the present disclosure relates to a method for testing MEMS devices, and to a corresponding test structure.

BACKGROUND

If molecules in an etching liquid react with a material to be etched, there is no reason for them to react more with the bottom of the material to be etched than with the side of a hole created in that material. This results in what is called underetching: an etch that takes place under the side of a mask. Under-etching is often a limit to a semiconductor technology and needs to be controlled.

Under-etching experiments typically require the measurement of the horizontally etched distance underneath a film, e.g. a mask that partially covers the etched material. This cover material, when under-etched, is generally referred to as the structural layer in surface micro-machining, while the material etched away underneath the structural layer is generally referred to as the sacrificial layer. Different techniques can be adopted in order to measure the amount of underetching so that the under-etch rate of the sacrificial material can be calculated.

Figure 1:
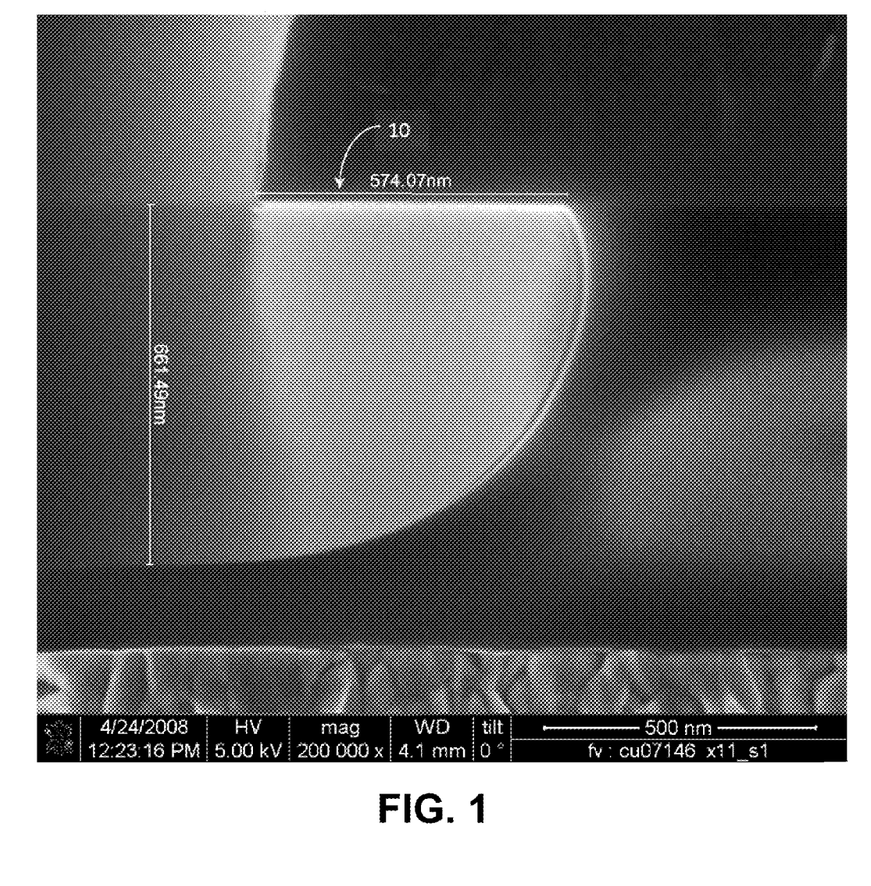
FIG. 1 illustrates measurement results of blanket etch (vertical) and under-etch (horizontal) using XSEM.

Cross-section scanning electron microscopy (XSEM) is a reliable and accurate technique which allows a direct measurement of the under-etched distance 10 or the amount of top layer undercut (FIG. 1). However, sample preparation may be a tedious process because sample cleavage is needed at a specific location, without destroying the under-etched structure.

Measurement of the undercut through top view imaging becomes possible when the top layer is transparent or when it is removed. When the top layer is transparent, optical microscopy can directly be used. In the literature, several test structures such as etch channels, etch holes, etch plates and a square matrix were proposed for this purpose, for example in M. Van Oort and M. Verwillegen, "Strain diagnostics- and etch technology mask set for surface micro-machined structures", Master's thesis, Hogeschool van Utrecht, UMECC, Utrecht Micro engineering Competence Centre, 2000; in D. J. Monk, D. S. Soane, and R. T. Howe, "Hydrofluoric acid etching of silicon dioxide sacrificial layers", J. Electromech. Soc., 141(1):264-269, 1994; and in R. Hellin Rico, B. Du Bois, J-P. Celis, and A. Witvrouw, "Characterization of the etching of Ge sacrificial layers for surface micromachining of MEMS", In Proceedings 15th Micromechanics Europe Workshop, pages 115-118, 2004.

Figure 2A:
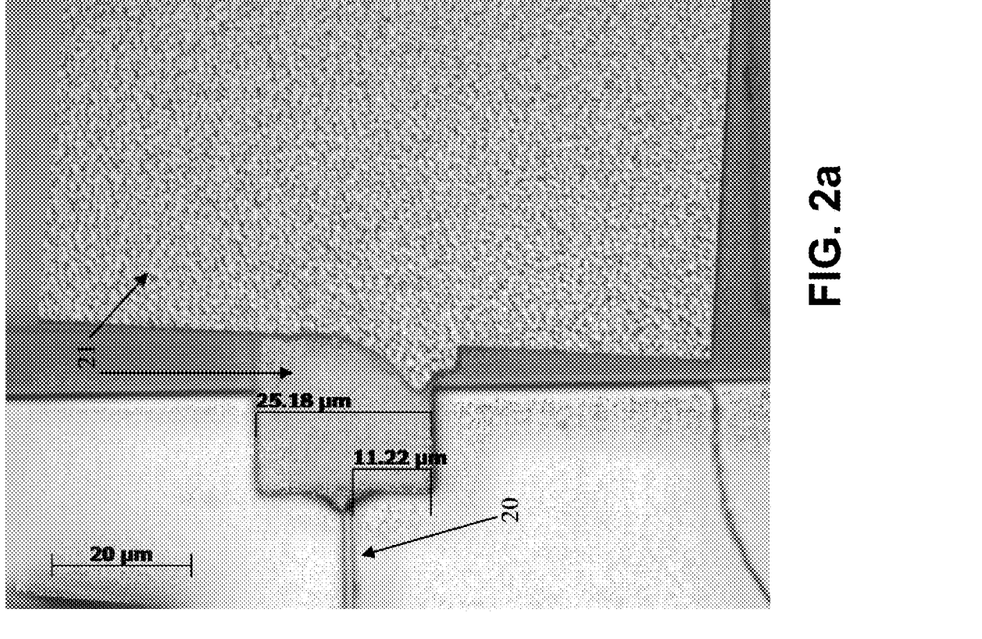
Figure 2B:
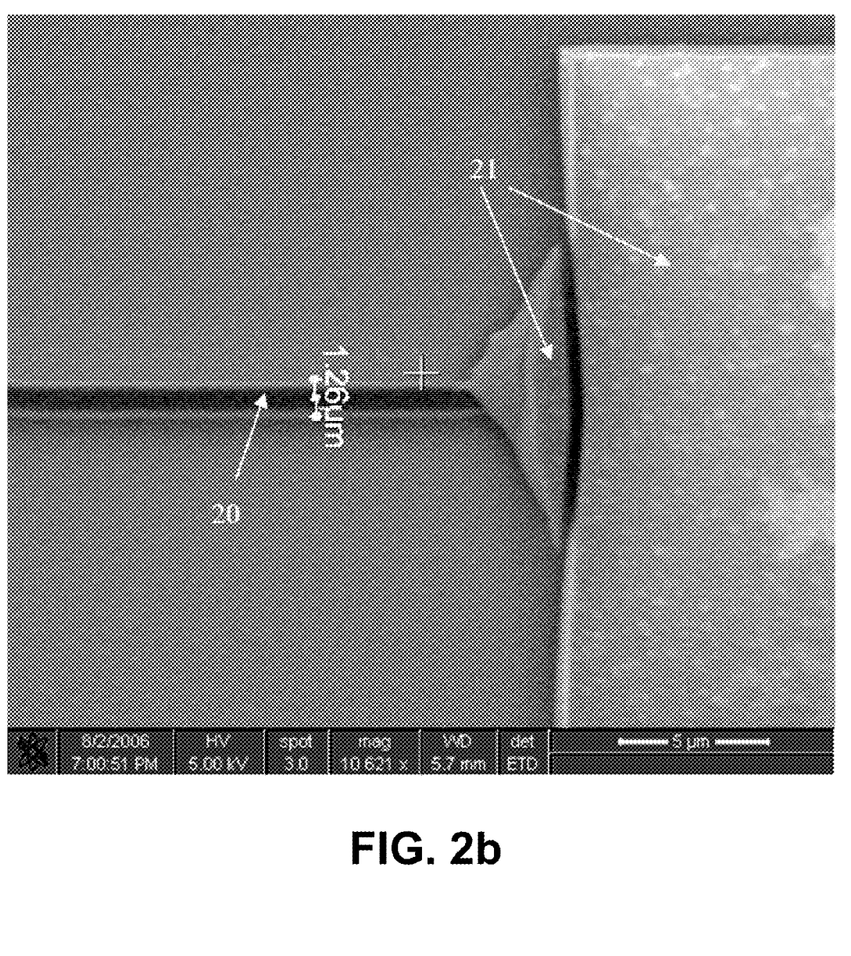

If the top layer is not transparent, both optical microscopy (FIG. 2a) and top view SEM (FIG. 2b) can be used, but extra sample preparation is necessary as the top layer needs to be removed. Removal of the top layer can be done by using a selective dry or wet etch process that removes only the top layer without affecting the material under investigation, by scratching off the top layer away with a sharp tip, or by tearing the top layer off with adhesive tape. All these methods are thus destructive. FIG. 2a shows an optical microscopy image of a narrow line of sacrificial layer material 20 which is made visible after tearing off the structural layer (top layer) 21 with adhesive tape. FIG. 2B shows a top view SEM image which offers higher resolution than the optical microscopy image (FIG. 2a). One can distinguish the narrow line of sacrificial layer 20 material and some debris of the structural layer 21.

As mentioned in Tom Cheyney, "More important, more complex: Mems metrology", Solid State, March:56-58, 2008, infrared inspection could be used to monitor undercut after sacrificial etching underneath Si and poly-Si in a non-destructive way. Although this technique can be used as inspection tool in, for example, the inspection at various stages of packaging as described in M. K. Shell and Golwalkar S., "Applications of infrared microscopy for bond pad damage detection", IEEE/RPS, pages 152-159, 1991 and in A. Trig, "Applications of infrared microscopy to IC and MEMS packaging", IEEE Transaction on electronics package manufacturing, 26(3):232-238, 2003, its application as a metrological instrument for undercut determination remains vague.

Another alternative to monitor the under-etched distance is the use of acoustic microscopy. This technique makes use of the large difference in the speed of sound between the liquid etchant and the solid material that is being etched, as described in D. J. Monk, D. S. Soane, and R. T. Howe, "Hydrofluoric acid etching of silicon dioxide sacrificial layers", J. Electromech. Soc., 141(1):264-269, 1994. This technique allows in-situ monitoring of the etch front movement.

All the described approaches for under-etch determination are either destructive and/or time consuming Furthermore, these approaches are not able to generate large amounts of data in a short time.

SUMMARY

The present disclosure describes structures and methods to determine under-etch in a semiconductor device.

Particular aspects are set out in the accompanying independent and dependent claims. Features from the dependent claims may be combined with features of the independent claims and with features of other dependent claims as appropriate and not merely as explicitly set out in the claims.

In a first aspect, a method for determining the presence of a sacrificial layer under a structure is disclosed. The method includes:

providing at least one structure arranged above a substrate having a major surface lying in a plane, wherein the structure is clamped at at least one side;

exerting a force (e.g., a mechanical force) on the at least one structure, the force having a predetermined amplitude and having a component perpendicular to the substrate;

determining the deflection of the structure perpendicular to the plane of the substrate; and correlating the deflection of the structure to the presence of a sacrificial layer between the substrate and the structure.

In particular embodiments, the exerted force is substantially perpendicular, and preferably perpendicular, to the substrate. Depending on the angle between the vertical component of the force and the plane of the surface, higher amplitude of the force may be necessary. The amplitude of the force, for example mechanical force, must be high enough to be able to push the structure completely against the substrate. With substantially perpendicular is meant that the mechanical force does not deviate more than 45 degrees from the perpendicular direction to the substrate. In an example, the force (e.g., a mechanical force) does not deviate more than 10 to 20 degrees from the perpendicular direction to the substrate.

Although embodiments of certain aspects are related to the use of a mechanical force exerted on the at least one structure, any other vertical force may be exerted on the at least one structure, so long as this force enables a deflection of the structure. For example, the force may be an electrostatic or a magnetic force. When applying an electrostatic force to the at least one structure, extra features may be used to enable electrical probing, such as a (semi)conducting bottom electrode (substrate) and a (semi)conducting top electrode (structural layer).

In embodiments of this disclosed aspect, a sacrificial layer may or may not be present between the substrate and the structure, the presence of the sacrificial layer being dependent on a previous step for removing the sacrificial layer.

In a second aspect, a method for determining the presence of a sacrificial layer under a structural layer is disclosed. The method includes:

providing at least one structure arranged above a substrate having a major surface lying in a plane and a sacrificial layer between the structure and the substrate;

subjecting the sacrificial layer to a an etching step for removing at least a part of the sacrificial layer, the etching step having a predetermined etch time;

exerting a force (e.g., a mechanical force) on the at least one structure, the force having a predetermined amplitude and a component perpendicular to the substrate;

determining the deflection of the structure perpendicular to the plane of the substrate;

correlating the deflection of the structure to the presence of a sacrificial layer between the substrate and the structure; and determining whether the sacrificial layer is removed given the predetermined etch time.

According to embodiments, the step of determining whether the sacrificial layer is removed given the predetermined etch time further comprises determining a position where the sacrificial layer is removed given the predetermined etch time. Determining a position may include for example determining the x-coordinate of the structure where the sacrificial layer is removed. It is an advantage of certain embodiments that by determining a position an automatic measurement is possible instead of manually counting the amount of non-released beams.

In a third aspect, a method for determining the presence of a sacrificial layer under a structural layer is disclosed. The method includes:

providing at least two structures arranged above a substrate having a major surface lying in a plane and a sacrificial layer between the at least two structures and the substrate, the at least two structures having a different geometry;

subjecting the sacrificial layer to an etching step for removing at least a part of the sacrificial layer, the etching step having a predetermined etch time;

exerting a force (e.g., a mechanical force) on the first of the at least two structures, the force having a predetermined amplitude and a component perpendicular to the substrate;

determining the deflection of the first of the at least two structure perpendicular to the plane of the substrate;

correlating the deflection of the first structure to the presence of a sacrificial layer between the substrate and the first structure;

repeating the exerting step, the determining step and the correlating step for at least the second structure of the at least two structures; and determining from the result of the correlating step for which of the at least two structures the sacrificial layer is removed given the predetermined etch time.

In a method as recited in embodiments of this third aspect, the at least two structures are arranged in an array format. In an embodiment, the at least two beams in the array have a different width. In another embodiment, the at least two beams are arranged in a series so that they have ascending or descending width along the series, e.g. they are arranged from the smallest width to the largest width or from the largest width to the smallest width.

In a method as recited in embodiments of this third inventive aspect, the repeating steps are done in the order from small to the largest width or from the largest to the smallest width.

In an embodiment of the present disclosure, the at least two structures form a test structure. The test structure may be part of a substrate on which MEMS devices can be processed. The method of the present disclosure may be used to determine the etching conditions for removing the sacrificial layer in the MEMS devices.

In a method as recited in embodiments of the first aspect, the second aspect and the third aspect of this disclosure the structure is not removed. In a method as recited in embodiments of the present disclosure, the structure is not damaged. In a method as recited in embodiments of the present disclosure, the structure is preserved during performing the method of the present disclosure. Therefore, beneficially, methods according to embodiments of the present disclosure are not destructive.

A method as recited in embodiments of the first aspect, the second aspect and the third aspect of this disclosure may use a determination of the position of the sacrificial layer via a time-dependent process.

In a method as recited in embodiments of the first aspect, the second aspect and the third aspect of this disclosure the substrate may include any underlying material or materials that may be used, or may contain or upon which a device such as a MEMS device, a mechanical, electronic, electrical, pneumatic, fluidic or semiconductor component or similar, a circuit or an epitaxial layer may be formed. In embodiments, this "substrate" may include, for example, a semiconductor substrate such as, for example, a doped or undoped silicon, a gallium arsenide (GaAs), a gallium arsenide phosphide (GaAsP), an indium phosphide (InP), a germanium (Ge), or a silicon germanium (SiGe) substrate. The "substrate" may include, for example, an insulating layer such as a $SiO_2$ or an $Si_3N_4$ layer in addition to a semiconductor substrate portion. Thus, the term substrate also includes substrates like silicon-on-glass, silicon-on sapphire substrates, flexible substrates. The term "substrate" is thus used to define generally the elements for layers that underlie a layer or portions of interest. Also, the "substrate" may be any other base on which a layer is formed, for example a glass substrate or a glass or metal layer. In the following, processing will mainly be described with reference to processing on silicon substrates but those of ordinary skill in the art will appreciate that examples in accordance with the present disclosure may be implemented based on other semiconductor material systems and that the person of ordinary skill in the art can select suitable materials as equivalents, such as, for instance, glass substrates.

In a method as recited in embodiments of the first aspect, the second aspect and the third aspect of this disclosure, the structure may include a structure to be used in MEMS applications. In an embodiment, the structure may be formed by depositing at least one structural layer on a sacrificial layer and then patterning the structural layer. In an embodiment of the present disclosure, the structure may be freestanding or may not be freestanding. A non-freestanding structure may include a sacrificial layer under the structure.

In a method as recited in embodiments of the first aspect, the second aspect and the third aspect of this disclosure, the structure may be clamped at at least one point of the structure. In a particular embodiment, the structure may be defined in three dimensions—two dimensions are lying substantially in the plane of the underlying substrate and the third dimension is the depth of the structure. In a particular embodiment, the two dimensions are not in the plane of the substrate, but are tilted towards or away from the substrate. An example is a curved cantilever beam. In a particular embodiment, the structure may be a beam, a circular structure, a rectangular structure, a finger-shaped structure or any structure than can be freestanding when the sacrificial layer is removed.

In a method as recited in embodiments of the present disclosure, the structure is a single clamped or a double clamped beam, the beam having a width and a length.

In a method as recited in embodiments of the first aspect, the second aspect and the third aspect of this disclosure, the width of the structure is selected such that the determining step allows for the determination of an under-etch distance. In particular embodiments, providing at least one structure may comprise selecting the width of the at least one structure such that the determining step allows for the determination of a required under-etch distance for freeing at least one of the at least one structures. This may be useful for a fast quality control during e.g. a MEMS production process where for example a minimum under-etch distance is required. The under-etch distance may be defined as the distance over which the sacrificial layer is removed from under the structure. The under-etch distance may be calculated starting from a sidewall of the structure up to the position where the sacrificial layer is present.

In a method as recited in embodiments of the present disclosure, the etching process is characterized by the ability to at least partially remove the sacrificial layer under the structure. This is also called under-etching. In another embodiment, the etching process is characterized by an under-etching rate. In yet another embodiment, the etching process comprises subjecting the sacrificial layer to a chemical compound at a predetermined temperature and pressure for a predetermined time.

In embodiments of the first aspect, the second aspect and the third aspect of this disclosure, the method of the present disclosure is repeated with a different etch rate.

In a method as recited in embodiments of the present disclosure, the determining step comprises determining the presence or absence of the sacrificial layer for a predetermined etching process.

In a method as recited in embodiments of the first aspect, the second aspect and the third aspect of this disclosure, the deflection by exerting a force, for example mechanical force, may be at least the thickness of the sacrificial layer. The correlating step may comprise correlating a deflection that is at least the sum of the thickness of the structure and the thickness of the sacrificial layer to the absence of the sacrificial layer, while it comprises correlating a deflection that is less than the sum of the thickness of the structure and the thickness of the sacrificial layer to the presence of the sacrificial layer.

In a method as recited in embodiments of the first aspect, the second aspect and the third aspect of this disclosure, exerting a mechanical force may be performed by a device adapted for exerting a predetermined force in the direction perpendicular to the plane of the substrate. In a particular embodiment, the device may be a probe tip. The probe tip size may be selected such that it allows contacting the structure. In a particular embodiment of the third aspect, the probe tip size is smaller than the sum of the smallest beam width and its distance with respect to an adjacent beam. In an embodiment, the device is arranged to perform the exerting step for each structure of the array. In another particular embodiment, the device is arranged to move substantially in the plane parallel to the substrate.

In a method as recited in embodiments of the first aspect, the second aspect and the third aspect of this disclosure, determining the deflection may be performed by a device for determining the position of the structure in a plane perpendicular to the plane of the substrate. The device may be a device for characterizing a surface, such as for example a surface profile measuring device. In an embodiment, the device may be a stylus profiler. In an embodiment, the device may be a contact surface profilometer where a low force stylus is moved across the array. In another embodiment, the device may be a device for performing nanoindentation experiments, for example atomic force microscopy (AFM).

In embodiments of the present disclosure, determining the deflection may be performed by a device for determining the position of a structure in a plane parallel to the major surface of the substrate. Such determination of the position co-ordinates of the structure may be useful in automated measurements.

In a method as recited in embodiments of the first aspect, the second aspect and the third aspect of this disclosure, exerting a force, for example mechanical force, and determining the deflection are performed by a same device. The device may be a device for characterizing the surface, such as for example a surface profile measuring system. In an embodiment, the device may be a stylus profiler. In an embodiment, the device may be a contact surface profilometer where a low force stylus is moved across the array.

Determining the deflection may result in a determination of the deflection of the structure. The correlating step may reveal for each of the at least one structures the presence or absence of a sacrificial layer underneath it. If the method according to embodiments of the present disclosure is applied to at least two structures, the widest structure for which no sacrificial layer is present may reveal the minimal amount of under-etching. The minimal under-etch distance may be calculated as half of the width of the completely undercut structure. The measurement resolution may be determined by half the width difference between subsequent beams in the beam array, in particular for example half the width difference between the widest structure for which no sacrificial layer is present and the smallest structure for which sacrificial layer is still present.

In a fourth aspect, a device is disclosed, the device comprising:
a substrate or supporting layer,
an array of at least two beams, the at least two beams having a different width,
a sacrificial layer that may or may not be present between the substrate or supporting layer and each of the at least two beams.

In another aspect, the present disclosure provides a test structure for determining the presence or absence of a sacrificial layer under a semiconductor structure, the test structure including at least one beam and a device, such as a mechanical device 42, for exerting a predetermined force in a direction perpendicular to the plane of the substrate. The test structure is arranged to (i) determine a deflection of the at least beam perpendicular to the plane of the substrate and (ii) correlate the deflection of the at least one structure to the presence of a sacrificial layer between the substrate and the at least one beam.

In embodiments of the present disclosure, the mechanical device is arranged to perform an exerting step for each of the at least one beam. In embodiments of the present disclosure, the mechanical device may be adapted for providing a mechanical force; the mechanical device may for example comprise a probe tip. In alternative embodiments, the mechanical device may be adapted for providing for example an electrostatic or magnetic force. In particular embodiments, the mechanical device may be arranged to move substantially in a plane parallel to the substrate. The test structure may further comprise an array of beams wherein each beam has a different width.

In a fifth aspect, the present disclosure provides the use of the method according to embodiments of the first aspect, the second aspect and the third aspect.

In an embodiment, the test structure is part of a substrate that further comprises MEMS devices including cantilever beams.

The present disclosure provides a test structure for determining the presence of a sacrificial layer under a semiconductor structure, the test structure comprising at least one beam and a device, for example a mechanical device, for exerting a predetermined force in a direction perpendicular to the plane of the substrate.

In an embodiment, the device, for example mechanical device, is arranged to perform an exerting step for each of the at least one beams. In an embodiment, the mechanical device comprises a probe tip. In an embodiment, the device, for example mechanical device, is arranged to move substantially in a plane parallel to the substrate.

For purposes of summarizing the disclosure and the advantages achieved over the prior art, certain objects and advantages of the present disclosure have been described herein above. Of course, it is to be understood that not necessarily all such objects or advantages may be achieved in accordance with any particular embodiment of the disclosure. Thus, for example, those skilled in the art will recognize that the examples in accordance with the present disclosure may be embodied or carried out in a manner that achieves or optimizes one advantage or group of advantages as taught herein without necessarily achieving other objects or advantages as may be taught or suggested herein.

BRIEF DESCRIPTION OF THE FIGURES

The drawings are only schematic and are non-limiting. In the drawings, the size of some of the elements may be exaggerated and not drawn on scale for illustrative purposes. In the different drawings, the same reference signs refer to the same or analogous elements.

FIG. 2a and FIG. 2b show a visualization of under-etch underneath a non-transparent film after removing the top layer, wherein FIG. 2a is an optical microscope image and FIG. 2b is a SEM image.

DETAILED DESCRIPTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising" should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Figure 3:
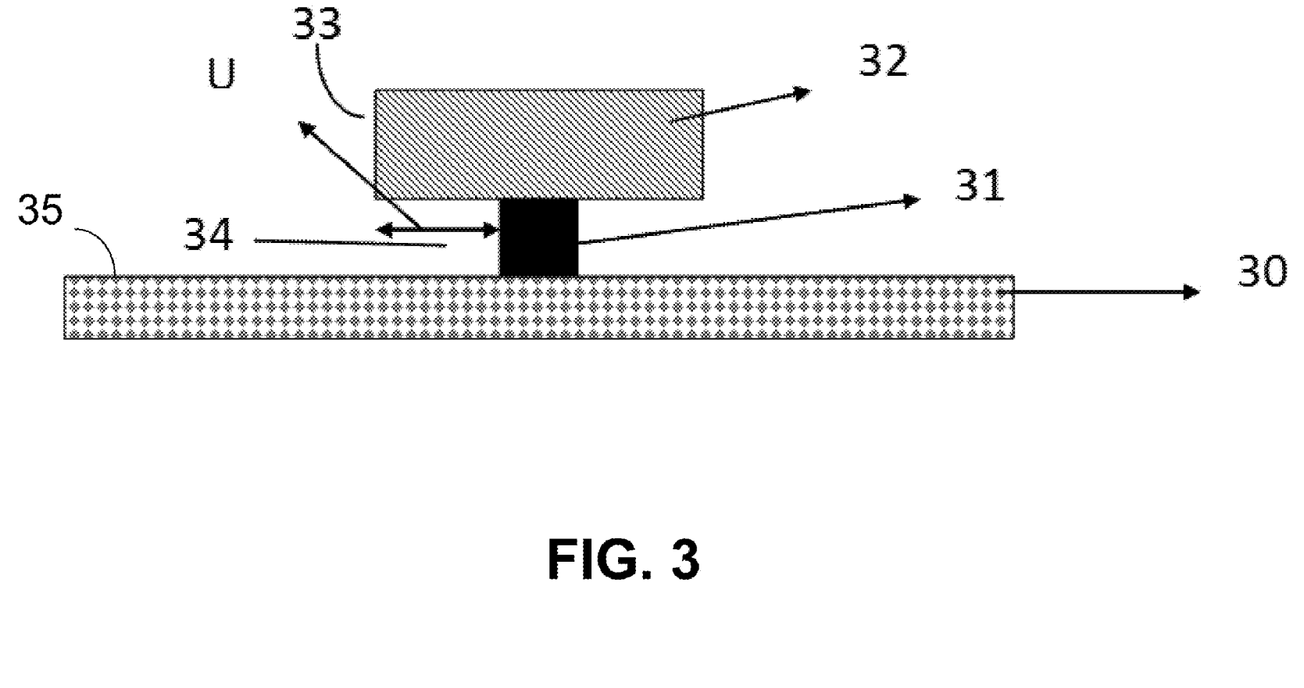
FIG. 3 illustrates the definition of under-etch distance.

Methods and devices according to embodiments of the present disclosure allow for determination of under-etch distance. The under-etch distance may be defined as the distance over which a sacrificial layer is removed from under a structure. The under-etch distance may be calculated starting from a sidewall of the structure up to the position where the sacrificial layer is still present. For illustrative purposes, this is shown in FIG. 3.

At least a substrate 30 having a major surface 35 lying in a plane, with a sacrificial layer 31 and a structural layer on top must be provided, both sacrificial layer 31 and structural layer being parallel to the plane of the major surface 35 of the substrate 30. This may be for example parallel to the wafer surface on which the different layers are formed. This may be for example parallel to the top surface of the substrate. The substrate 30 may comprise another stack of layers not taking place in the sacrificial etch process. On a substrate 30, a sacrificial layer 31 is provided, upon which a structural layer is provided. The structural layer may be patterned so as to form a structure 32, and the sacrificial layer 31 may be etched from underneath the structure 32. The longer the etching step lasts, the deeper the structure 32 is under-etched. The under-etch distance U is the distance over which the sacrificial layer 31 is removed from under the structure 32. The under-etch distance U is the distance between a sidewall 33 of the structure 32 and a remaining part of the sacrificial layer 31.

Figure 9:
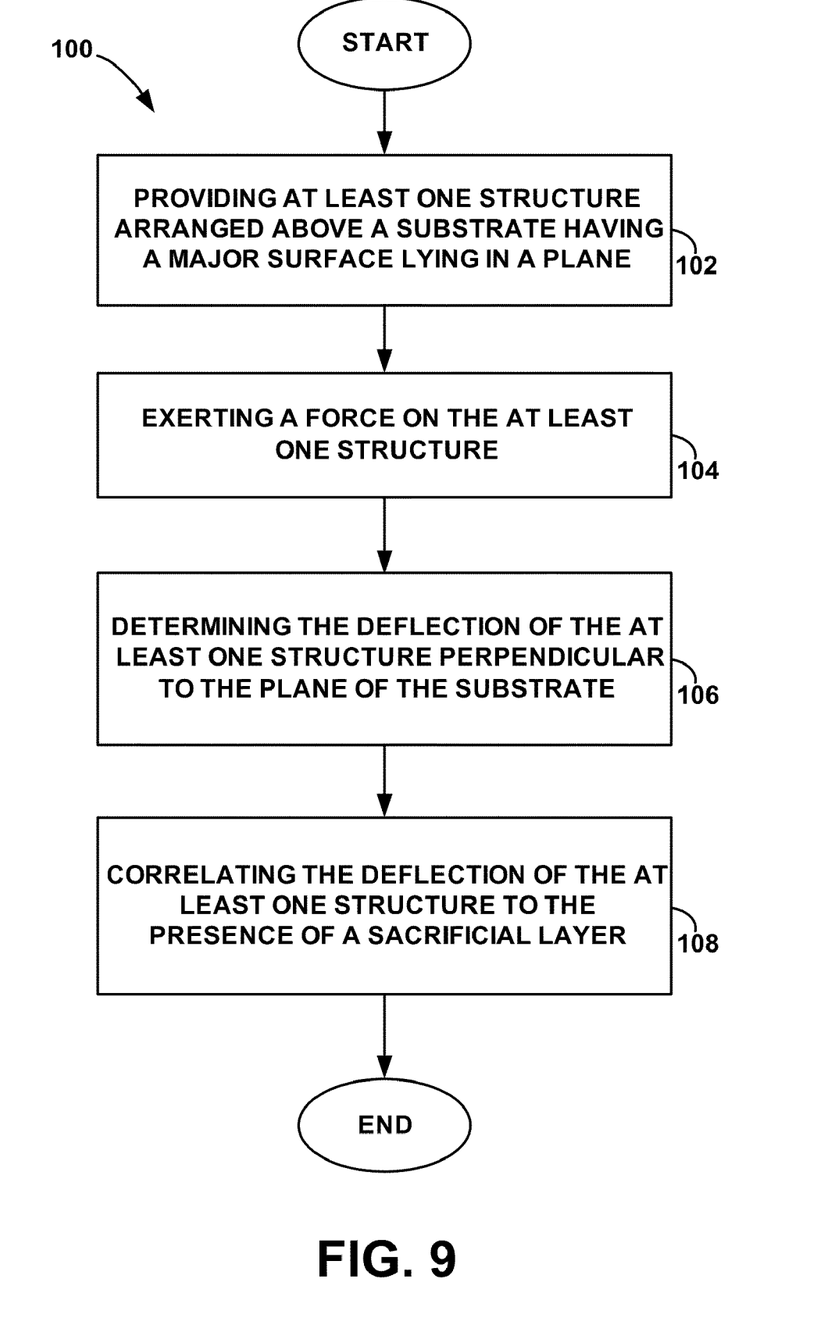
FIG. 9 illustrates a method in accordance with an example of the present disclosure.

Embodiments of the present disclosure comprise a method for determining the presence or absence of a sacrificial layer under a structure 32. An example method 100 is depicted in FIG. 9. The method includes, at step 102, providing at least one structure 32 arranged above a substrate 30 lying in a plane, wherein the structure 32 is clamped at at least one side. The method further includes, at step 104, exerting a force (e.g., a mechanical force) on the at least one structure 32 The force may have a predetermined amplitude and a component perpendicular to the substrate 30. The method still further includes, at step 106, determining the deflection of the structure 32 in a direction perpendicular to the plane of the substrate 30. Further, the method includes, at step 108, correlating the deflection of the structure 32 to the presence (or absence) of a sacrificial layer 31 between the substrate 30 and the structure 32.

In a particular embodiment of a method according to the present disclosure, a sacrificial layer 31 is provided between the at least one structure 32 and the substrate 30 before the force, for example mechanical force, is exerted. The sacrificial layer 31 is subjected to a an etching step during a predetermined etch time, so as to remove at least a part of the sacrificial layer 31, hence creating an empty space 34 under the at least one structure 32. The empty space 34 starts at a sidewall 33 of the at least one structure 32, and underlies at least part of the at least one structure 32. The empty space 34 extends over an under-etch distance U under the at least one structure 32. After the etching step has lasted for the predetermined etch time, a force, for example mechanical force, is exerted on the at least one structure 32, the force having a predetermined amplitude and a component perpendicular to the substrate 30. The exerted force, for example mechanical force, leads to a deflection of the at least one structure 32, the deflection being dependent on the amplitude of the force and on the amount of sacrificial layer 31 remaining present under the at least one structure 32. In a next step, the determined deflection of the at least one structure 32 is correlated to the presence or absence of sacrificial layer 31 underneath the structure 32. This allows a determination of whether or not the sacrificial layer 31 is completely removed during the predetermined etch time.

In a particular embodiment according to the present disclosure, the at least one structure comprises at least two structures, for example an array of structures, like a series of structures. In particular embodiments, the series of structures may be a series of parallel fingers 40a, 40b, 40c, 40d, 40e as for example illustrated in FIG. 4. The at least two structures have a different geometry. In the example illustrated in FIG. 4, the parallel fingers 40a, 40b, 40c, 40d, 40e in the series have a different width. In the example illustrated in FIG. 4, subsequent fingers 40b, 40c, 40d, 40e in the series have a larger width when going over the series from left to right. The fingers 40a, 40b, 40c, 40d, 40e are clamped at one extremity of the fingers 40a, 40b, 40c, 40d, 40e, in the example illustrated in FIG. 4 the remote extremity.

A force with a predetermined amplitude and a component perpendicular to the substrate is exerted on the first one 40a of the series of fingers. The force may for example be a mechanical force, which may for example be exerted by surface stylus profilometry. Depending on the presence of a sacrificial layer underneath the first finger 40a, this first finger 40a is deflected more or less in a direction perpendicular to the substrate. Hence the deflection of the first finger 40a may be correlated to the presence or absence of a sacrificial layer between the substrate and the first finger 40a. In the embodiment illustrated in FIG. 4, no sacrificial layer is present between the substrate and the first finger 40a, hence the first finger 40a is pushed down to the substrate by the exerted force, for example mechanical force.

Thereafter, a force, for example a mechanical force, with a predetermined amplitude, preferably the same amplitude as the amplitude of the force exerted on the first finger 40a, and a component perpendicular to the substrate is exerted on the second finger 40b. Depending on the presence of a sacrificial layer underneath the second finger 40b, this second finger 40b is deflected more or less in a direction perpendicular to the substrate. Hence the deflection of the second finger 40b may be correlated to the presence or absence of a sacrificial layer between the substrate and the second finger 40b. In the embodiment illustrated in FIG. 4, no sacrificial layer is present between the substrate and the second finger 40b, hence the second finger 40b is pushed down to the substrate by the exerted force, for example mechanical force.

Thereafter, a force with a predetermined amplitude, preferably the same amplitude as the amplitude of the force, for example mechanical force, exerted on the first finger 40a and the second finger 40b, and a component perpendicular to the substrate is exerted on the third finger 40c. Depending on the presence of a sacrificial layer underneath the third finger 40c, this third finger 40c is deflected more or less in a direction perpendicular to the substrate. Hence the deflection of the third finger 40c may be correlated to the presence or absence of a sacrificial layer between the substrate and the third finger 40c. In the embodiment illustrated in FIG. 4, a part 41c of the sacrificial layer is present between the substrate and the third finger 40c, hence the third finger 40b is not substantially pushed down towards the substrate by the exerted force, for example mechanical force.

Figure 4:
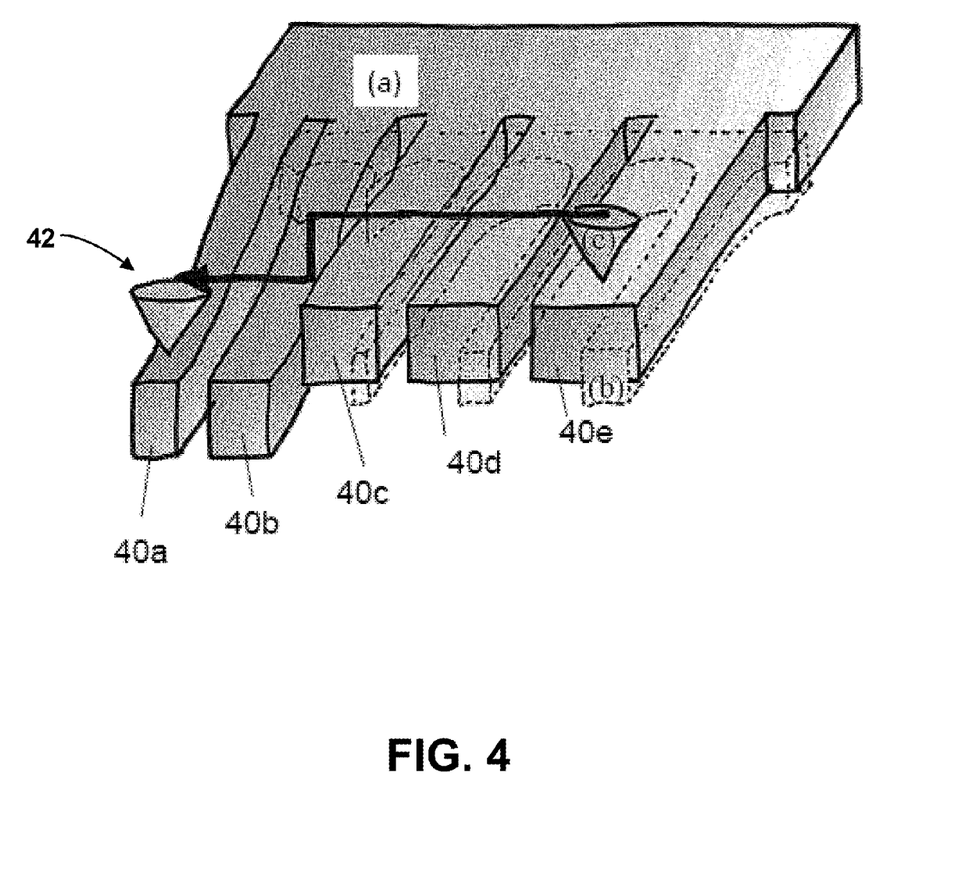
FIG. 4 illustrates the principle of a cantilever based under-etch test structure according to embodiments of the present disclosure using contact surface profilometry. (a) Cantilever beam array with a gradual variation in beam width. (b) The remaining sacrificial material after etching. (c) Tip of the surface profiler scanning from right to left (from wide to narrow cantilever) and pushing the freestanding structure towards the substrate when the structural layer is completely undercut.

The exerting step, determining step and correlating step are further repeated for each of the remaining fingers 40d, 40e.

From the result of the correlating steps carried out for each of the fingers 40a, 40b, 40c, 40d, 40e it may be determined for which of the fingers the sacrificial layer is removed during the etching step with predetermined etch time. In the example illustrated in FIG. 4, it may be determined that the sacrificial layer is removed from underneath the fingers 40a, 40b, but not from underneath the fingers 40c, 40d, 40e. From this result, the under-etch distance corresponding to the etch step with predetermined etch parameters may be determined.

The methods according to embodiments of the present disclosure have various advantages:

An array of structures, e.g. cantilever beams, with a gradual variation in width, as the fingers 40a, 40b, 40c, 40d, 40e in the illustration of FIG. 4, could also be used for an optical inspection of the amount of under-etch. Such optical type of measurement requires that the strain gradient in the film produces measurable tip deflections for released structures. During optical type of measurements, a check is made whether a structure is out of focus with respect to a reference, so as to prove any out of plane deformation. Such out of plane deformation leads to a conclusion that the structure is freestanding, but it does not give any information about the presence of sacrificial layer residues. Hence optical type of measurements might require structures with a sufficient length, e.g. long beams. In contrast, when using contact surface profilometry as in accordance with embodiments of the present disclosure, the needed beam length for either cantilevers (clamped at one extremity) or clamped-clamped beams (clamped at two extremities) may be determined by their vertical stiffness and the maximum applicable stylus force. Another advantage over this optical technique is that contact surface profilometry enables the detection of the transition from unreleased to released structures. The theoretical uncertainty using a structure array in combination with contact surface profilometry is equal to half the width variation in the structure array. The measurement using the prior art optical technique could result in a larger uncertainty because nearby released structures (case c of FIG. 7) can appear as being fully released. The sacrificial etch rate will be overestimated in this case.

Examples

A test structure in accordance with embodiments of the present disclosure may be used to determine the under-etch rate in a non-destructive and less time consuming manner than previously known in the art. This test structure—which may be an array of freestanding beams (cantilever or clamped-clamped beams) with a fixed beam length and a gradually changing width—may be used in conjunction with a contact surface profilometer that scans over the beam array with a pre-determined force (e.g., schematically illustrated in FIG. 4).

Figure 5:
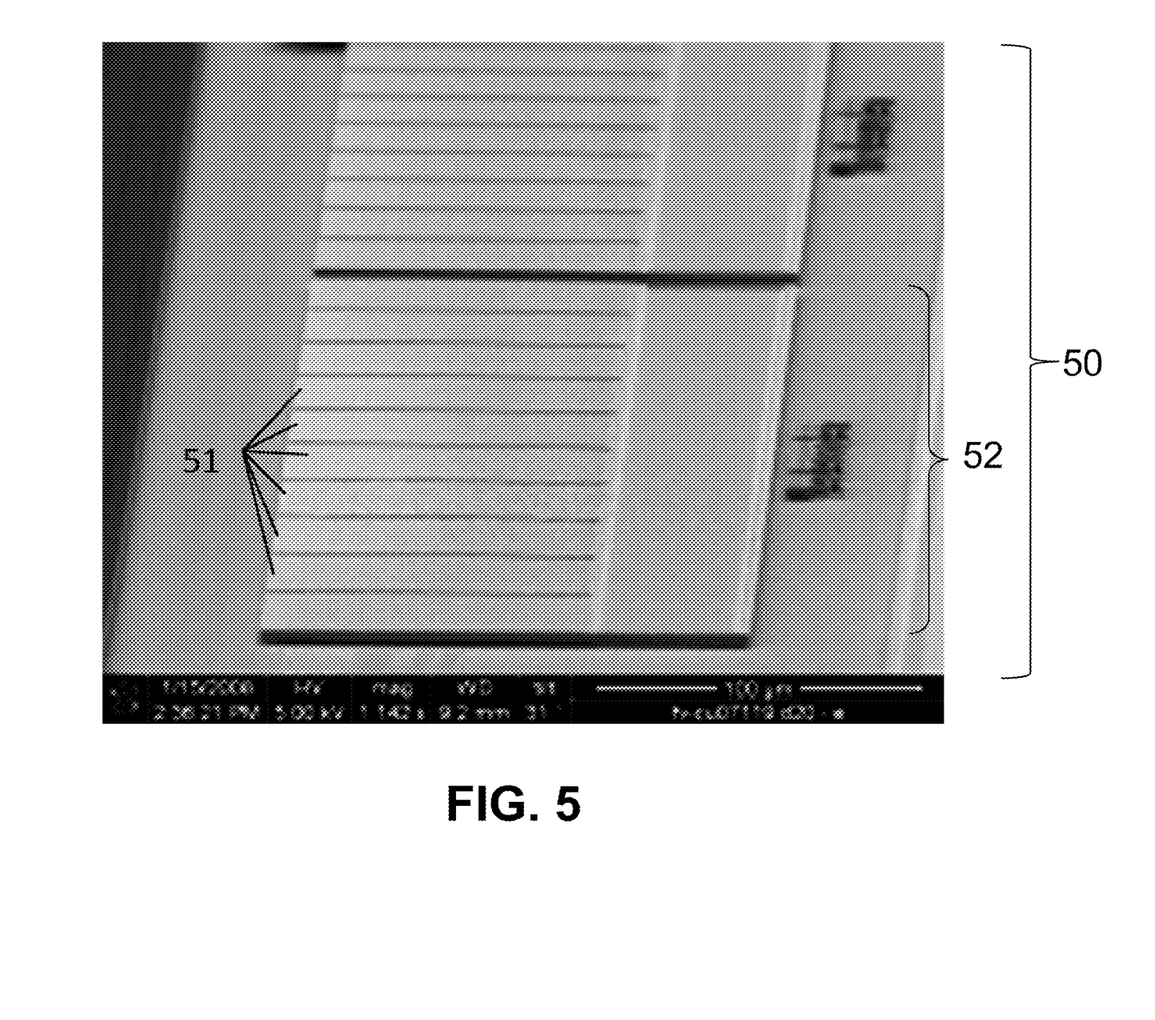
FIG. 5 is a picture of part of an under-etch test structure according to an embodiment of the present disclosure, made out of an array of 50 cantilever beams with a length of 100 µm, a width variation of 1 µm and a maximum width of 50 µm.

In accordance with embodiments of the present disclosure, as the scan is performed from large to narrow beam width, the scan profile reveals at which beam width the structure is pushed down. The beam width at which the structure is pushed completely or substantially completely to the bottom (substrate) reveals the amount of undercut after etching. The under-etch is calculated as the half of the completely undercut beam width. The measurement resolution is determined by half the width difference between subsequent beams in the beam array. FIG. 5 shows a part of a surface micro-fabricated under-etch test structure made out of an array of 50 cantilever beams 51, divided in sub-arrays 52 of 10 beams each, with a length of 100 μm, a width variation of 1 μm and a starting width of 50 μm. Hence, in this example, it is possible to measure under-etching up to 24.5 μm with a resolution of 500 nm.

Figure 6:
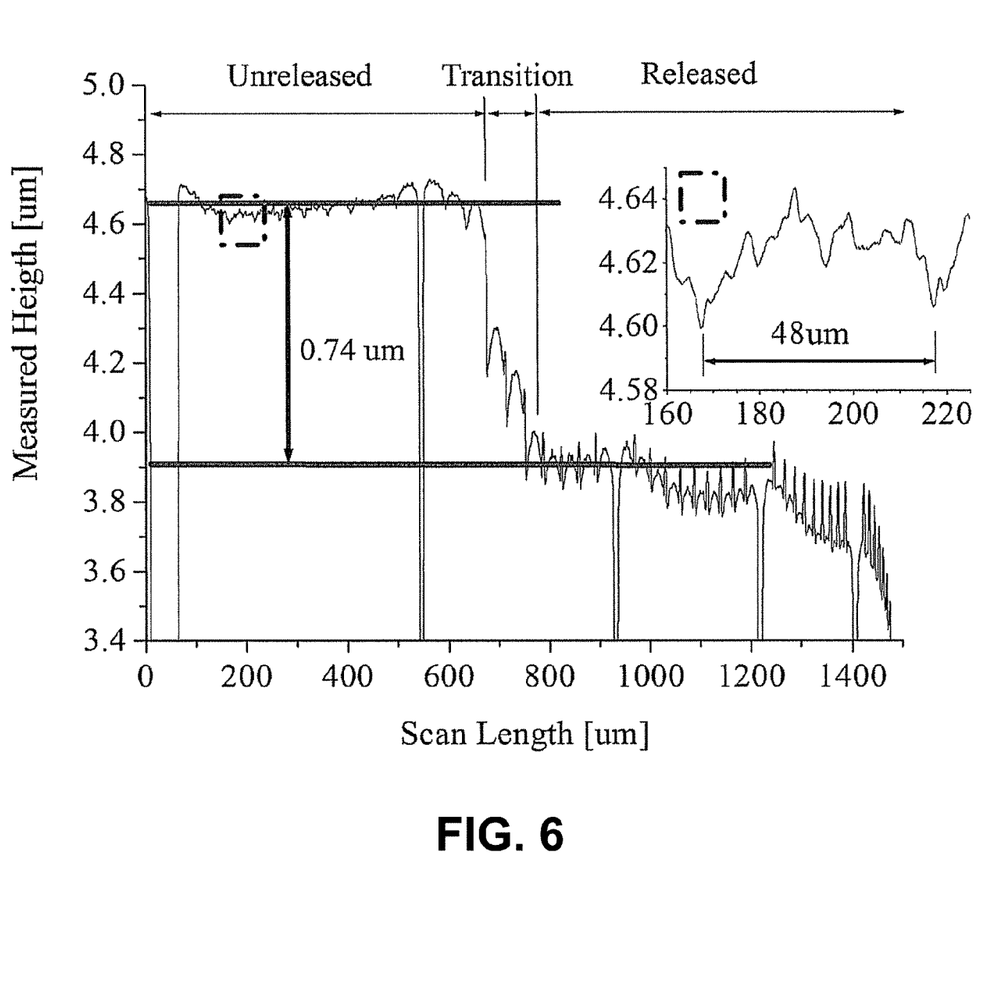
FIG. 6 is a scan profile of a 4 µm thick under-etch test structure using contact surface profilometry according to an embodiment of the present disclosure. The scan is performed from left to right. The largest beam width is 50 µm and the beam width gradually changes in steps of 1 µm. The beam is observed to be fully released at 34 µm, hence the under-etch distance is equal to 17 µm. The inset shows a part of the scan profile; specifically it is the combination of the vertical deformation of a laterally scanned beam and the tip convolution of the mechanical actuator (48 µm wide) having an under-etch of 17 µm.

FIG. 6 shows a typical scan profile resulting from such a surface profilometer measurement according to embodiments of the present disclosure. The scan was performed from large to narrow beam width (50 μm to 1 μm) (left to right in the graph of FIG. 6). The absolute displacement of the stylus is plotted as function of the scan length. Each time the surface profiler has scanned over a single beam along its width, a bump is observed in the scan profile. A detail of these bumps can be seen in the inset of FIG. 6, for a beam width of 48 μm. This typical deflection curve occurs due to the vertical compliance of the undercut part of the structural layer (FIG. 7a). Also tip convolution may be considered when analyzing the deflection curve. Thick structural layers in combination with a relatively small under etch will not show such a bump shape.

As can be seen in FIG. 6, there is substantially no sharp transition in measured height from the unreleased to the released cantilever beams. This gradual transition may be attributed to very narrow remaining sacrificial layer lines.

Figure 7:
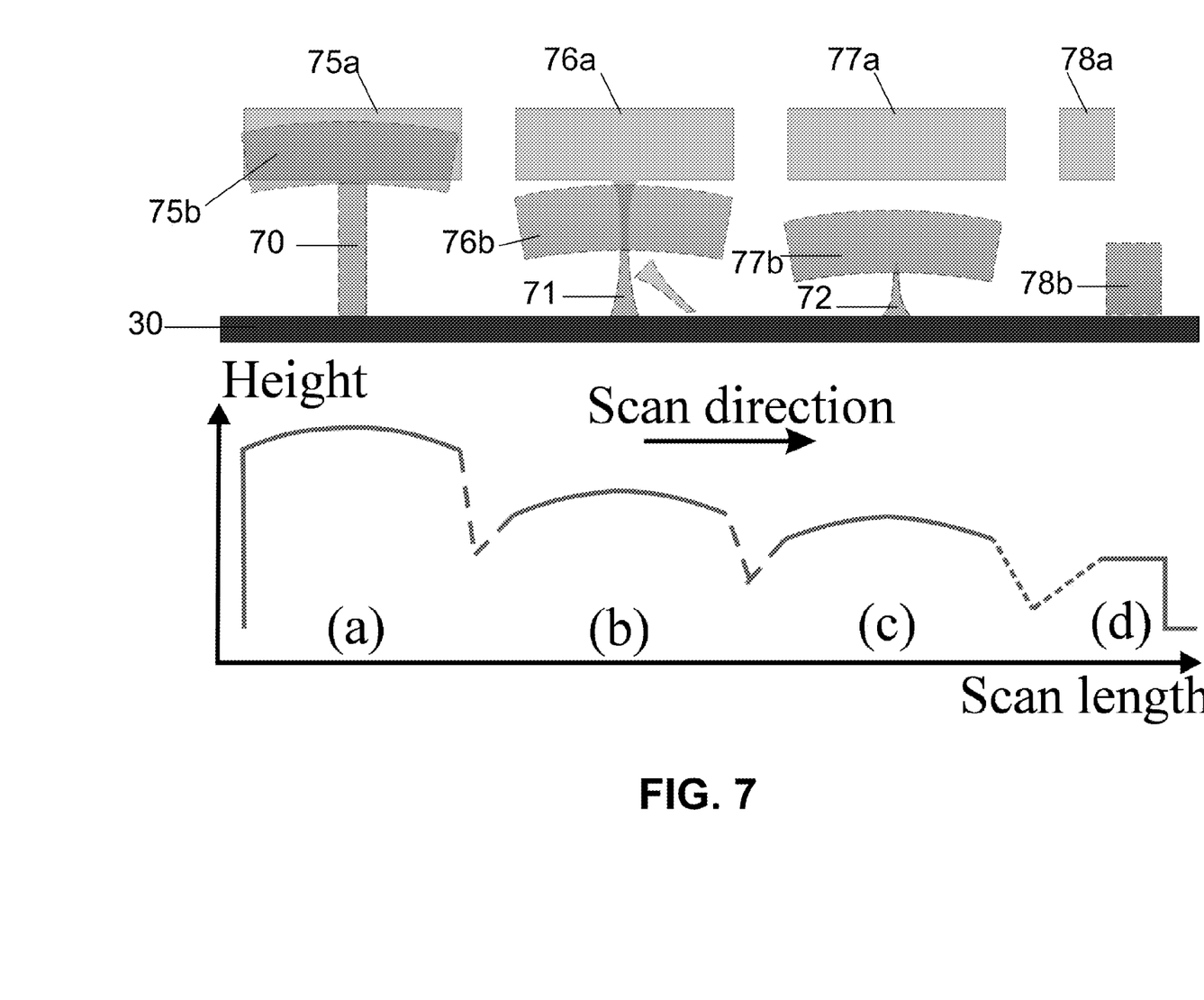
FIG. 7.: Observed scan profile in conjunction with the assumed global deformation of the cantilever beams before and after performing the scan in accordance with embodiments of the present disclosure. The dashed line in the scan profile below represents the tip convolution of the surface profilometer tip. (a) Unreleased structure (b) Nearly released structure with broken sacrificial layer column underneath the beam. (c) Nearly released structures with some sharp sacrificial layer residues. (d) Fully released narrow beam structure that is pushed both aside and to the bottom, hence the deeper and wider tip convolution of the surface profilometer.

FIG. 7 illustrates different possibilities of release of the beams. FIG. 7(a) illustrates the case of a beam 75a which after the etching step is still supported by a substantial amount of sacrificial material 70. When a force, for example mechanical force, is exerted on the beam 75a, it may show a slight deformation, but it remains substantially at the same level in a direction perpendicular to the substrate 30. In the transition part of the scan (FIGS. 7(b), 7(c)), the sacrificial layer 71, 72 could have two shapes. The first shape is a column 71 with a height equal to the sacrificial layer thickness. This column 71 can be so narrow that it breaks under the application of the stylus force (FIG. 7(b)), so that the beam 76a is deflected upon application of the force, for example mechanical force, and is pushed towards the substrate 30—see situation illustrated by 76b. The second shape is a lasting sharp tip 72 with a height less than the original sacrificial layer thickness, but still forming an obstacle prohibiting the cantilever 77a to go to its lowest position (FIG. 7(c)), hence leading to a situation as illustrated by 77b. As a consequence a structure 78a can only be assumed to be fully released, and thus functional, when the beam is at its lowest position 78b—see FIG. 7(d).

The scan profile as illustrated in FIG. 6 is a combination of the profilometer tip convolution and the deformation of the movable structures (dashed lines of the scan profile in FIG. 7). As can be seen in FIGS. 6 and 7(d), the scan profile goes further down, even when the released beams 78a already touches the substrate 30. This may be caused by the fact that the cantilevers 75a, 76a, 77a, 78a become more and more narrow when the stylus is performing its scan from left to right. Due to the gradual narrowing of the cantilever structures, their lateral stiffness strongly decreases. Hence, the cantilever structures are forced to move both laterally and vertically. This allows the stylus to deflect much deeper in between two adjacent narrow beams. As a consequence, a gradually decreasing deflection profile is seen.

In another example clamped-clamped beams (double clamped beams) are used instead of cantilever beams because of their higher lateral stiffness. This will ease a software based interpretation of the scan profile to determine the amount of under-etch. This especially may be significant for automated measurements.

Figure 8:
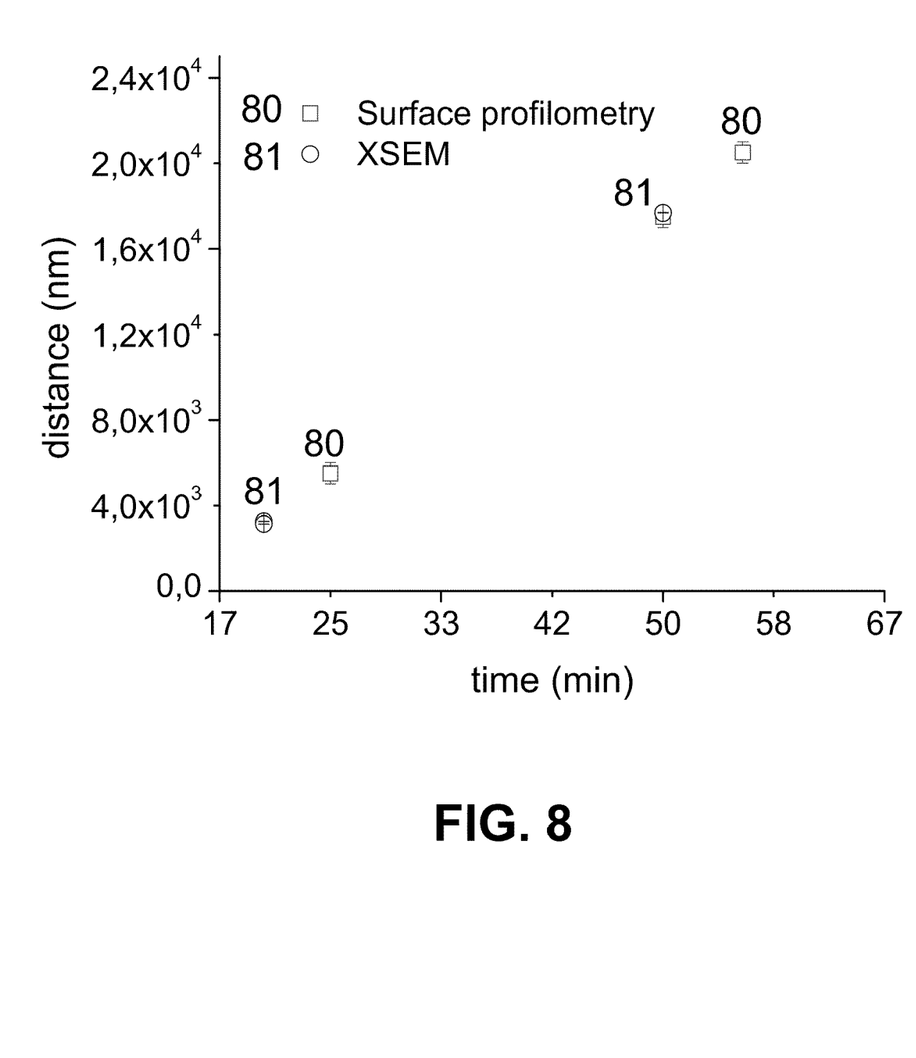
FIG. 8: Measured under-etch distance in function of etching time as measured using according to embodiments of certain inventive aspects and measured using cross-sectional SEM.

FIG. 8 shows measurement results of the under-etch distance obtained by using cross-sectional SEM 81 (circles) and by using method according to embodiments of certain inventive aspects 80 (surface profilometry, squares). The under-etch distance is determined for different etching times. A sacrificial oxide layer is sandwiched in between a poly-SiGe structural layer and a SiC bottom layer (top part of the substrate). Etching is a buffered hydrofluoric etch (7:1 volume ration of $NH_4F$ to HF). For cross-sectional SEM the measurement uncertainty is assumed to be 10 nm, whereas for surface profilometry it is assumed to be 500 nm.

While the invention has been illustrated and described in detail in the drawings and foregoing description, such illustration and description are to be considered illustrative or exemplary and not restrictive. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to include any specific characteristics of the features or aspects of the invention with which that terminology is associated.

What is claimed is:

1. A method for determining the presence of a sacrificial layer under a structure, the method comprising:
   providing at least one structure arranged above a substrate having a major surface lying in a plane, wherein the at least one structure is clamped at at least one side;
   exerting a force on the at least one structure, the force having a predetermined amplitude and a component perpendicular to the substrate;
   determining a deflection of the at least one structure perpendicular to the plane of the substrate; and
   correlating the deflection of the at least one structure to the presence of a sacrificial layer between the substrate and the at least one structure.

2. A method according to claim 1, further comprising:
   before exerting the force, (i) providing a sacrificial layer between the at least one structure and the substrate and (ii) subjecting the sacrificial layer to a an etching step for removing at least a part of the sacrificial layer, wherein the etching step has a predetermined etch time; and
   after the correlating step, determining whether the sacrificial layer is removed during the etching step having the predetermined etch time.

3. A method according to claim 2, wherein the etching step at least partially removes the sacrificial layer under the at least one structure.

4. A method according to claim 2,
   wherein providing at least one structure and providing a sacrificial layer comprise providing at least two structures arranged above a substrate having a major surface lying in a plane and a sacrificial layer between the at least two structures and the substrate, wherein the at least two structures have a different geometry,
   wherein exerting a force comprises exerting a force on the first of the at least two structures, the force having a predetermined amplitude and having a component perpendicular to the substrate,
   wherein determining the deflection comprises determining the deflection of the first of the at least two structures perpendicular to the plane of the substrate,
   wherein correlating the deflection to the presence of a sacrificial layer comprises correlating the deflection of the first structure to the presence of a sacrificial layer between the substrate and the first structure,
   the method further comprising:
   repeating the exerting step, the determining step and the correlating step for at least the second structure of the at least two structures; and
   determining from the result of the correlating steps for which of the at least two structures the sacrificial layer is removed during the predetermined etch time.

5. A method according to claim 4, wherein repeating the exerting step, the determining step and the correlating step is performed in order from largest to smallest width of the at least two structures.

6. A method according to claim 4, wherein repeating the exerting step, the determining step and the correlating step is performed in order from smallest to largest width of the at least two structures.

7. A method according to claim 4, wherein exerting a force comprises exerting a force by means of a probe tip, wherein the probe tip size is smaller than the sum of the smallest width of the at least two structures and its distance to the adjacent structure.

8. A method according to claim 1, wherein exerting a force having a component perpendicular to the substrate comprises exerting a force substantially perpendicular to the substrate.

9. A method according to claim 1, wherein providing at least one structure comprises selecting the width of the at least one structure such that the determining step allows for the determination of a required under-etch distance for freeing at least one of the at least one structures.

10. A method according to claim 1, wherein determining the deflection is performed by a device for determining the position of the structure in a plane perpendicular to the plane of the substrate.

11. A method according to claim 10, wherein determining the deflection is performed by a device selected from the group consisting of a surface profile measuring device, a stylus profiler, a contact surface profilometer, and a device for performing nanoindentation experiments.

12. A method according to claim 1, wherein determining the deflection is performed by a device for determining the position of the structure in a plane parallel to the major surface of the substrate.

13. A method according to claim 1, wherein the force is a mechanical force.

14. A method according to claim 1, wherein the method is used for determining etching conditions for removing the sacrificial layer in a MEMS device.

15. The method according to claim 14, wherein determining etching conditions comprises determination of a position of the sacrificial layer via a time-dependent process.

16. A test structure for determining the presence or absence of a sacrificial layer under a semiconductor structure, the test structure comprising:
   at least one beam; and
   a mechanical device for exerting a predetermined force in a direction perpendicular to a plane of the substrate, wherein the test structure is arranged to (i) determine a deflection of the at least beam perpendicular to the plane of the substrate and (ii) correlate the deflection of the at least one structure to the presence of a sacrificial layer between the substrate and the at least one beam.

17. A test structure according to claim 16, wherein the predetermined force is a force selected from the group consisting of a mechanical force, an electrostatic force, and a magnetic force.

18. A test structure according to claim 16, wherein the mechanical device comprises a probe tip.

19. A test structure according to claim 16, wherein the mechanical device is arranged to move substantially in a plane parallel to the substrate.

20. A test structure according to claim 16, wherein the at least one beam comprises an array of beams.

* * * * *